(12) United States Patent
Park et al.

(10) Patent No.: US 11,439,029 B2
(45) Date of Patent: Sep. 6, 2022

(54) ELECTRONIC DEVICE AND HOUSING STRUCTURE

(71) Applicant: SAMSUNG ELECTRONICS CO., LTD., Suwon-si (KR)

(72) Inventors: Jeongseok Park, Suwon-si (KR); Yongkang Zhou, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 180 days.

(21) Appl. No.: 16/881,188

(22) Filed: May 22, 2020

(65) Prior Publication Data

US 2021/0267069 A1 Aug. 26, 2021

(30) Foreign Application Priority Data

Feb. 24, 2020 (CN) .......................... 202010112539.1

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
None
See application file for complete search history.

(56) References Cited

U.S. PATENT DOCUMENTS 10,496,134 B2 * 12/2019 Park .................... H01L 27/3244
10,545,359 B2 * 1/2020 Sano ................. G02F 1/133308
10,656,736 B2 * 5/2020 Lin .......................... B32B 27/06
10,819,381 B2 * 10/2020 Lee ....................... G06F 1/1637
10,903,445 B2 * 1/2021 Baek ................... H01L 51/0097
(Continued)

FOREIGN PATENT DOCUMENTS

CN 101652035 A 2/2010
CN 207184571 U 4/2018
(Continued)

OTHER PUBLICATIONS

Communication dated Apr. 8, 2021 issued by the State Intellectual Property Office of the P.R.China in application No. 202010112539.1.

(Continued)

*Primary Examiner* — Xanthia C Cunningham
(74) *Attorney, Agent, or Firm* — Sughrue Mion, PLLC

(57) ABSTRACT

Provided is an electronic device including a display arranged on a front face of the electronic device; and a housing structure forming at least a part of a side exterior of the electronic device and a back exterior of the electronic device, wherein the housing structure may include: a transparent housing comprising a side region arranged on a side face of the electronic device, a back region arranged on a back face of the electronic device, and a connection region connecting the side region with the back region; a transparent pattern layer arranged on an inner surface of the back region of the transparent housing and comprising a pattern; and a color layer disposed on an inner surface of the transparent pattern layer in the back region of the transparent housing, and disposed on an inner surface of the side region of the transparent housing.

20 Claims, 17 Drawing Sheets

(56) References Cited

U.S. PATENT DOCUMENTS

| | | | |
|---|---|---|---|
| 2009/0231523 A1* | 9/2009 | Matsumoto | G02F 1/13394 349/110 |
| 2010/0035005 A1 | 2/2010 | Zhang et al. | |
| 2010/0038107 A1 | 2/2010 | Su et al. | |
| 2010/0040843 A1 | 2/2010 | Liao | |
| 2010/0108344 A1 | 5/2010 | Huang et al. | |
| 2015/0049285 A1* | 2/2015 | Qian | G02B 6/0073 349/106 |
| 2015/0362788 A1* | 12/2015 | Park | G02F 1/133308 349/58 |
| 2016/0062391 A1* | 3/2016 | Choi | H04M 1/0266 361/679.03 |
| 2016/0233037 A1* | 8/2016 | Lee | H01H 1/5805 |
| 2016/0255735 A1* | 9/2016 | Han | H04M 11/00 359/894 |
| 2016/0334896 A1* | 11/2016 | Koike | B32B 21/00 |
| 2016/0338214 A1 | 11/2016 | Wen | |
| 2017/0013731 A1* | 1/2017 | Lee | H05K 5/0017 |
| 2017/0069867 A1* | 3/2017 | Hirakata | H01L 51/52 |
| 2017/0075444 A1* | 3/2017 | Nade | H04M 1/0268 |
| 2018/0217434 A1* | 8/2018 | Kawata | G02F 1/13452 |
| 2018/0361630 A1 | 12/2018 | Kim et al. | |
| 2020/0401191 A1* | 12/2020 | Lee | G06F 1/1656 |
| 2021/0250434 A1* | 8/2021 | Choi | G06F 1/1626 |

FOREIGN PATENT DOCUMENTS

| | | |
|---|---|---|
| CN | 108551740 A | 9/2018 |
| CN | 108737595 A | 11/2018 |
| CN | 110322809 A | 10/2019 |
| CN | 110760083 A | 2/2020 |
| KR | 10-1613934 B1 | 4/2016 |

OTHER PUBLICATIONS

Communication dated Nov. 19, 2020 issued by the International Searching Authority in counterpart Application No. PCT/KR2020/006790 (PCT/ISA/220, PCT/ISA/210, and PCT/ISA/237).

Communication dated Oct. 10, 2020 issued by the State Intellectual Property Office of P.R. China in counterpart Chinese Application No. 202010112539.1.

Communication dated Aug. 5, 2021 issued by the State Intellectual Property Office of P.R. China in counterpart Chinese application No. 202010112539.1.

* cited by examiner

ELECTRONIC DEVICE AND HOUSING STRUCTURE

CROSS-REFERENCE TO THE RELATED APPLICATION

This application is based on and claims priority under 35 U.S.C. § 119 to Chinese Patent Application No. 202010112539.1, filed on Feb. 24, 2020, in the China National Intellectual Property Administration, the disclosure of which is incorporated by reference herein in its entirety.

BACKGROUND

1. Field

Various embodiments of the disclosure relate to an electronic device and a housing structure of the electronic device.

2. Description of Related Art

An electronic device may include a display module that outputs a screen in a front direction and a housing structure that forms a side exterior and a back exterior of the electronic device.

To improve appearance quality of the electronic device, an attempt to implement various patterns and colors of a housing structure has been actively made. For example, a film having various patterns and colors may be applied to an inner surface of a housing of the electronic device.

However, in a scheme where a film is applied to the inner surface of a housing, the film may not correctly adhere to a region corresponding to a single curved surface or double curved surface or cracks may be generated, on the inner surface of the housing.

SUMMARY

Embodiments of the disclosure address at least the above problem and/or other disadvantages not described above. However, the embodiments are not required to overcome the problem described above.

Provided are an electronic device having consistent and seamless color and pattern while applying a film to an inner surface of a housing, and a housing structure used in the electronic device.

Additional aspects will be set forth in part in the description which follows and, in part, will be apparent from the description, or may be learned by practice of the presented embodiments of the disclosure.

According to an embodiment of the disclosure, there is provided an electronic device including: a display arranged on a front face of the electronic device; and a housing structure forming at least a part of a side exterior of the electronic device and a back exterior of the electronic device, wherein the housing structure may include: a transparent housing comprising a side region arranged on a side face of the electronic device, a back region arranged on a back face of the electronic device, and a connection region connecting the side region with the back region; a transparent pattern layer arranged on an inner surface of the back region of the transparent housing and comprising a pattern; and a color layer disposed on an inner surface of the transparent pattern layer in the back region of the transparent housing, and disposed on an inner surface of the side region of the transparent housing.

The color layer may be arranged on the inner surface of the transparent pattern layer and an inner surface of a region where the transparent pattern layer is not arranged on the inner surface of the transparent housing.

The color layer may be arranged to cover the inner surface of the transparent pattern layer, an inner surface of the connection region of the transparent housing, and an inner surface of the side region of the transparent housing.

The side region, the back region, and the connection region of the transparent housing may be formed as one body.

A transparency of the transparent pattern layer may be greater than or equal to 50%.

The transparent pattern layer may include: a base layer; and a pattern layer arranged on the base layer.

The pattern layer may be arranged to face the back region on the base layer.

The pattern layer may be arranged to face a surface opposing the back region on the base layer.

The pattern of the transparent pattern layer may be a regular pattern, and the transparent pattern layer may include a plurality of transparent elements that are disposed apart from each other by a same interval.

The back region of the transparent housing may include a flat back wall and a curved back wall that is arranged on an edge of the first back wall and may extend in a direction from the back region to the connection region of the transparent housing.

According to an aspect of another embodiment, there is provided a housing structure configured to cover an electronic device, the housing structure including: a transparent housing comprising a side region arranged on a side face of the electronic device, a back region arranged on a back face of the electronic device, and a connection region connecting the side region with the back region; a transparent pattern layer arranged on an inner surface of the back region of the transparent housing and comprising a pattern; and a color layer disposed on an inner surface of the transparent pattern layer in the back region of the transparent housing, and disposed on an inner surface of the side region of the transparent housing.

The color layer may be arranged on the inner surface of the transparent pattern layer and an inner surface of a region where the transparent pattern layer is not arranged on the inner surface of the transparent housing.

The color layer may be arranged to cover the inner surface of the transparent pattern layer, an inner surface of the connection region of the transparent housing, and an inner surface of the side region of the transparent housing.

The side region, the back region, and the connection region of the transparent housing may be formed as one body.

A transparency of the transparent pattern layer may be greater than or equal to 50%.

The transparent pattern layer may include: a base layer; and a pattern layer arranged on the base layer.

The housing structure of claim 16, wherein the pattern layer is arranged to face the back region on the base layer.

The pattern layer may be arranged to face a surface opposing the back region on the base layer.

The pattern of the transparent pattern layer may be a regular pattern, and the transparent pattern layer may include a plurality of transparent elements that are disposed apart from each other by a same interval.

The back region may include a flat back wall and a curved back wall that is arranged on an edge of the first back wall and extends in a direction from the back region to the connection region of the transparent housing.

BRIEF DESCRIPTION OF THE DRAWINGS

The above and/or other aspects will be more apparent by describing certain example embodiments, with reference to the accompanying drawings, in which.

DETAILED DESCRIPTION

Figure 1A:
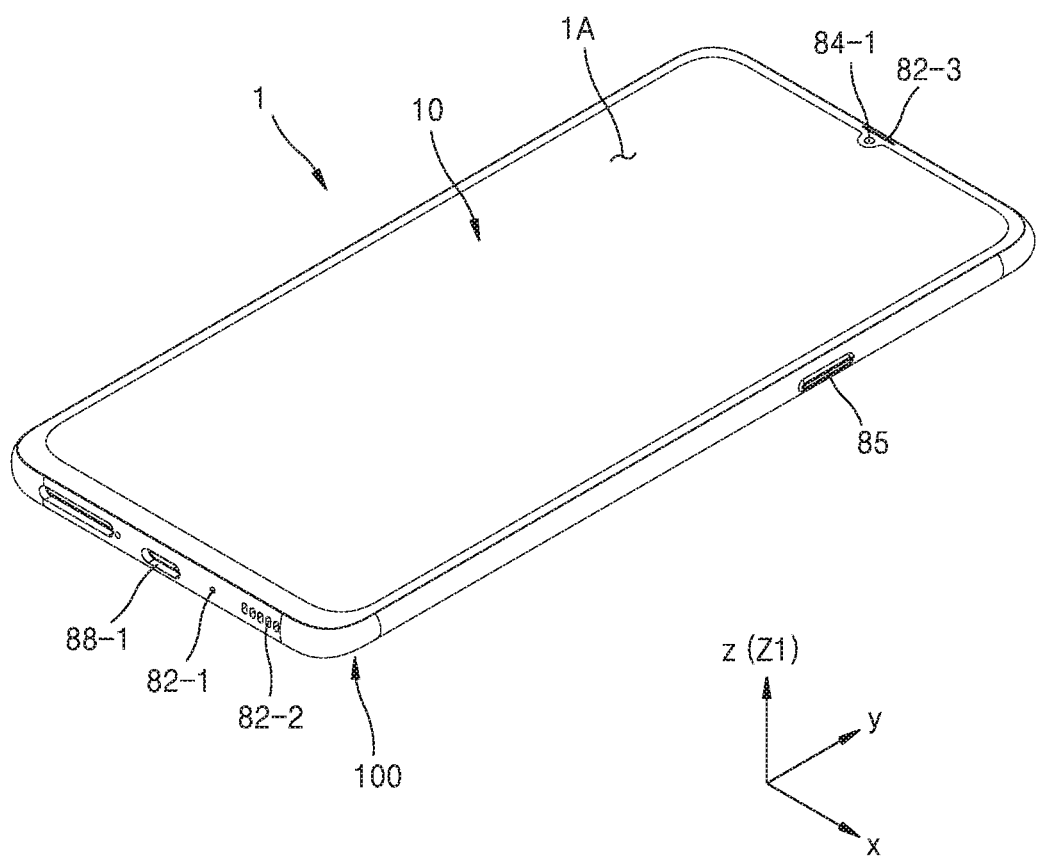
FIG. 1A is a perspective view of an electronic device according to an embodiment of the disclosure.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

Terms used herein will be described in brief, and the disclosure will be described in detail.

Although terms used in the disclosure are selected with general terms popularly used at present under the consideration of functions in the disclosure, the terms may vary according to the intention of those of ordinary skill in the art, judicial precedents, or introduction of new technology. In addition, in a specific case, the applicant voluntarily may select terms, and in this case, the meaning of the terms is disclosed in a corresponding description part of the disclosure. Thus, the terms used in the disclosure should be defined not by the simple names of the terms but by the meaning of the terms and the contents throughout the disclosure.

Throughout the entirety of the specification of the disclosure, when it is assumed that a certain part includes a certain component, the term "including" means that a corresponding component may further include other components unless a specific meaning opposed to the corresponding component is written.

The terms "first", "second", etc., will be used to distinguish one component from another component, rather than for a restrictive meaning.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Hereinafter, embodiments of the disclosure will be described in detail with reference to the attached drawings to allow those of ordinary skill in the art to easily carry out the embodiments of the disclosure. However, the disclosure may be implemented in various forms, and are not limited to the embodiments of the disclosure described herein. To clearly describe the disclosure, parts that are not associated with the description have been omitted from the drawings, and throughout the specification, identical reference numerals refer to identical parts.

Throughout the disclosure, the expression "at least one of a, b or c" indicates only a, only b, only c, both a and b, both a and c, both b and c, all of a, b, and c, or variations thereof. For example, the expression, "at least one of a, b, and c," should be understood as including only a, only b, only c, both a and b, both a and c, both b and c, all of a, b, and c, or any variations of the aforementioned examples.

An electronic device according to various embodiments of the disclosure may include at least one of a smart phone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), an MP3 player, mobile medical equipment, a camera, or a wearable device (e.g. smart glasses, a head mounted device (HMD)), an electronic cloth, an electronic bracelet, an electronic necklace, an electronic appcessory, an electronic tattoo, a smart mirror, or a smart watch.

According to some embodiments of the disclosure, the electronic device may be a smart home appliance. The electronic device may include, for example, at least one of a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a TV box (e.g., Samsung Home-Sync™, Apple TV™, or Google TV™), a game console (e.g., Xbox™ or PlayStation™), an electronic dictionary, an electronic key, a camcorder, or an electronic frame.

In another embodiment of the disclosure, the electronic device may include at least one of various medical equipment (e.g., a blood glucose monitoring meter, a heart rate monitor, a body temperature meter, etc.), a magnetic resonance angiography (MRA), magnetic resonance imaging (MRI), computed tomography (CT), an imaging device, or an ultrasonic device), a navigation system, a global positioning system (GPS) receiver, an event data recorder (EDR), a flight data recorder (FDR), a vehicle infotainment device, electronic equipment for ships (e.g., navigation systems and gyro compass for ships), avionics, a security device, a vehicle head unit, an industrial or home robot, an automatic teller's machine (ATM), a point of sales (POS), or Internet of things (e.g., electric bulbs, various sensors, electricity or gas meters, sprinkler devices, fire alarm devices, thermostats, streetlights, toasters, exercise machines, hot-water tanks, heaters, boilers, and so forth).

According to some embodiments of the disclosure, the electronic device may include a part of a furniture or building/structure, an electronic board, an electronic signature receiving device, a projector, and various measuring instruments (e.g., a water, electricity, gas, or electric wave measuring device). The electronic device according to various embodiments of the disclosure may be one of the above-listed devices or a combination thereof. The electronic device according to some embodiments of the disclosure may be a flexible electronic device. The electronic device according to various embodiments of the disclosure is not limited to the above-listed devices and may include new electronic devices according to technical development.

Hereinafter, an electronic device according to various embodiments of the disclosure will be described with reference to the accompanying drawings. Herein, the term "user" used herein may refer to a person who uses the electronic device or a device using the electronic device (e.g., an artificial intelligence electronic device).

Figure 1B:
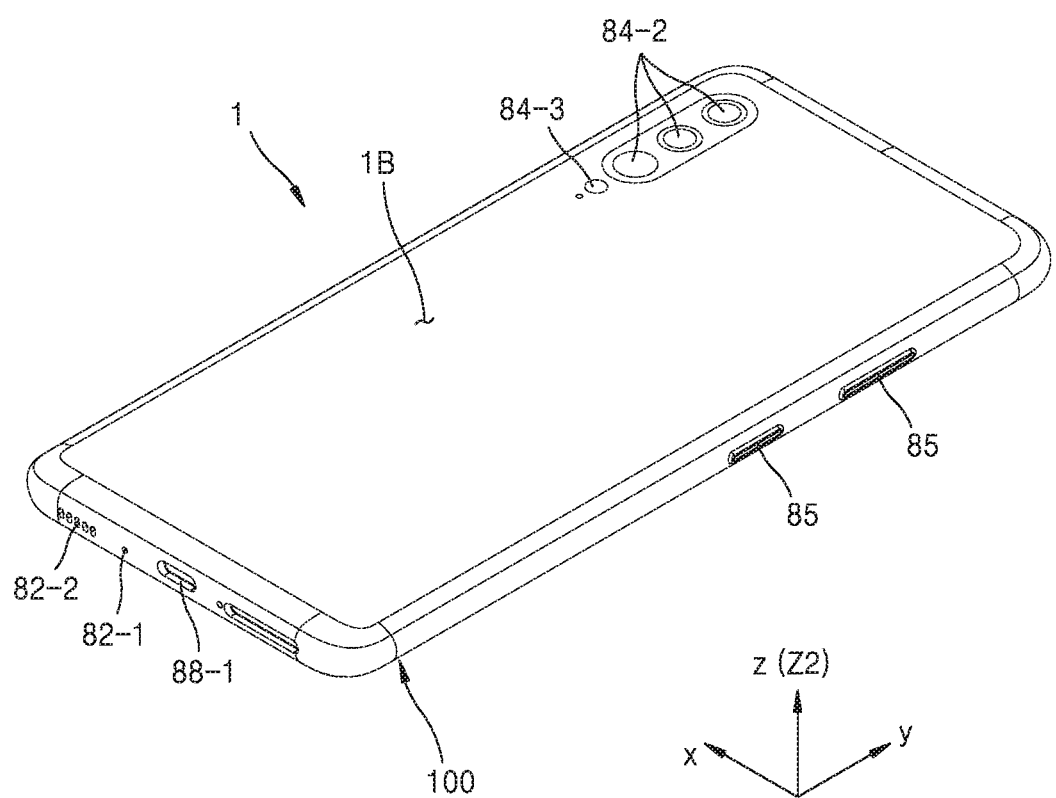
FIG. 1B is a perspective view of an electronic device, viewed at different angles, according to an embodiment of the disclosure.
Figure 2:
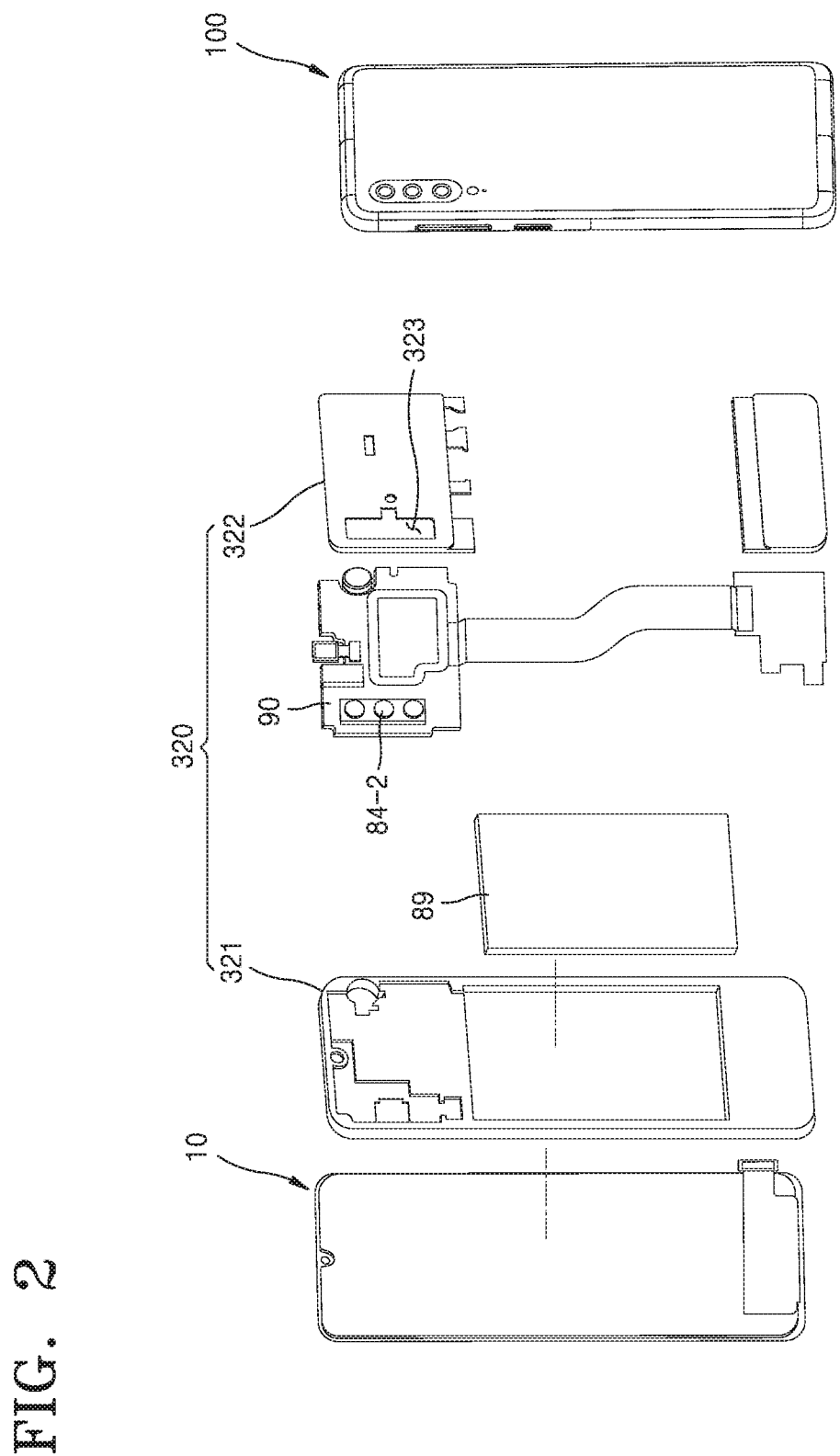
FIG. 2 is an exploded perspective view of an electronic device according to an embodiment of the disclosure.

FIGS. 1A and 1B are perspective views of an electronic device 1, viewed at different angles, according to an embodiment of the disclosure, and FIG. 2 is an exploded perspective view of the electronic device 1 according to an embodiment of the disclosure.

Referring to FIGS. 1A, 1B, and 2, the electronic device 1 may include a display module 10 that is arranged on a front face 1A and a housing structure 100 that forms a side exterior and a back exterior of the electronic device 1.

Herein, the front face 1A of the electronic device 1 is defined as a surface viewed when a user uses the electronic device 1 in a normal state to see an image displayed on the display module 10, and a back face 1B of the electronic device 1 is defined as a surface opposite to the front face 1A. A front direction Z1 is defined as a direction facing the user when the user uses the electronic device 1 in the normal state, and a rear direction Z2 is defined as a direction opposite to the front direction Z1.

In a front direction of the display module 10, a transparent member for protecting a surface of the display module 10 may be arranged.

For example, a cross-sectional shape of the display module 10 may be an overall flat shape without a curved shape. In another example, at least one of both end portions of the cross-sectional shape of the display module 10 may have a curved shape.

The display module 10 may have a length in a y direction, which is greater than a width in an x direction. However, the shape of the display module 10 may be various ones without being limited thereto.

The display module 10 may include a display panel that displays an image, information, etc., and a touch screen panel that detects a touch input. The display panel may include an organic light-emitting display (OLED) or a liquid crystal display (LCD). However, the display panel may be replaced with another display means, without being limited thereto.

The electronic device 1 may further include at least one of an electromagnetic induction panel, audio modules 82-1, 82-2, and 82-3, a sensor module, camera modules 84-1 and 84-2, a key input device 85, a light-emitting element, a pen input device, or a connector hole 88-1, in addition to the display module 10. In an embodiment of the disclosure, the electronic device 1 may omit at least one of the components (e.g., the key input device 85 or the light-emitting element) or further include other components.

The audio modules 82-1, 82-2, and 82-3 may include a microphone hole 82-1 and speaker holes 82-2 and 82-3. Inside the microphone hole 82-1 may be arranged a microphone for obtaining external sound, and may also be arranged a plurality of microphones for sensing a direction of the sound in an embodiment of the disclosure. The speaker holes 82-2 and 82-3 may include an external speaker hole 82-2 and a call receiver hole 82-3. In an embodiment of the disclosure, the speaker holes 82-2 and 82-3 and the microphone hole 82-1 may be implemented as one hole, or a speaker may be included without the external speaker hole 82-2 and the call receiver hole 82-3 (e.g., a piezo speaker).

A sensor module may generate an electrical signal or data value corresponding to an internal operating state or external environmental state of the electronic device 1. A sensor module may include a first sensor module (e.g., a proximity sensor) and/or a second sensor module (e.g., a fingerprint sensor) that are arranged in a front direction, and/or a third sensor module (e.g., a heart rate monitor (HRM) sensor) and/or a fourth sensor module (e.g., a fingerprint sensor) arranged in a rear direction. The fingerprint sensor may be arranged on the back face 1B as well as the front face 1A of the electronic device 1 (e.g., the display module 10). The electronic device 1 may further include at least one of a sensor module (e.g., a gesture sensor, a gyro sensor, an atmospheric pressure sensor, a magnetic sensor, an acceleration sensor, a grip sensor, a color sensor, an infrared (IR) sensor, a bio sensor, a temperature sensor, a humidity sensor, or an illuminance sensor).

The camera modules 84-1 and 84-2 may include a first camera device 84-1 arranged to face the front direction Z1 and a plurality of camera devices 84-2 arranged in the rear direction Z2. The camera modules 84-1 and 84-2 may include one lens or a plurality of lenses, an image sensor, and/or an image signal processor.

A flash 84-3 may include, for example, a light-emitting diode or a xenon lamp. In an embodiment of the disclosure, two or more lenses (e.g., an infrared (IR) camera, a wide lens, and a telephoto lens) and image sensors may be arranged on a surface of the electronic device 1.

The key input device 85 may be arranged on a housing structure 100. In another embodiment of the disclosure, the electronic device 1 may omit the key input device 85 entirely or a part thereof, and the omitted key input device 85 may be implemented in other forms such as a soft key, etc., on the display module 10. In an embodiment of the disclosure, the key input device 85 may include a sensor module arranged in the rear direction.

The light-emitting element may be arranged, for example, in the front direction. The light-emitting element may provide state information of the electronic device 1 in the form of light. In another embodiment of the disclosure, the light-emitting element may provide a light source operating with the camera module 84-1. The light-emitting element may include, for example, an LED, an IR LED, and a xenon lamp.

The connector hole 88-1 may include a first connector hole 88-1 capable of accommodating a connector (e.g., a universal serial bus (USB) connector) for transmitting and receiving power and/or data with an external electronic device and/or a second connector hole (e.g., an earphone jack) capable of accommodating a connector for transmitting and receiving an audio signal with the external electronic device.

The memory may include, for example, a volatile and/or nonvolatile memory.

An interface may include a high definition multimedia interface (HDMI), a universal serial bus (USB) interface, a secure digital (SD) card interface, and/or an audio interface. The interface may electrically or physically connect, for example, the electronic device 1 with an external electronic device, and may include an USB connector, an SD card/MMC connector, or an audio connector.

As shown in FIG. 2, a battery 89 may be a device for supplying power to at least one component of the electronic device, and may include, for example, a primary cell which is not rechargeable, a secondary cell which is rechargeable, or a fuel cell. At least a part of the battery 89 may be arranged on substantially the same plane as, for example, a printed circuit board 90. The battery 89 may be tightly integrated with the electronic device 1 not to be removable from the electronic device 1, or may be arranged removably from the electronic device 1.

An antenna may be arranged between a housing structure 100 and the battery 89. The antenna may include, for example, a near field communication (NFC) antenna, a wireless charging antenna, and/or a magnetic secure transmission (MST) antenna. The antenna may perform short-range communication with or wirelessly transmit and receive power needed for charging, to and from, for example, an external device. In another embodiment of the disclosure, an antenna structure may be formed by a part or a combination of the housing structure 100 and/or a support member 320.

The electronic device 1 may further include the support member 320 for supporting the above-described various parts.

The support member 320 may include a front support member 321 and a back support member 322. However, the support member 320 is not necessarily implemented as a plurality of members, and may be implemented as a single member when necessary.

The front support member 321 may be coupled with the display module 10 on a surface thereof and with the printed circuit board 90 on another surface thereof.

On the printed circuit board 90 are mounted a processor, a memory, and/or an interface. The processor may include one or more of, for example, a central processing unit, an application processor, a graphics processor, an image signal processor, a sensor hub processor, or a communication processor.

The back support member 322 may be arranged between the printed circuit board 90 and the housing structure 100. The back support member 322 may include a slit 323 that exposes the camera module 84-2 in the rear direction.

The housing structure 100 may be arranged in a rear direction of the front support member 321 and may form at least a part of the side exterior and the back exterior of the electronic device 1. The housing structure 100 may include a space for accommodating the back support member 322.

A partial region of the housing structure 100 may form a side exterior of the electronic device 1 together with the front support member 321, and another partial region of the housing structure 100 may form a back exterior of the electronic device 1. However, the side exterior of the electronic device 1 may be various ones without being limited thereto. For example, when the front support member 321 is omitted from the electronic device 1, the partial region of the housing structure 100 may form the entire side exterior of the electronic device 1.

Figure 3:
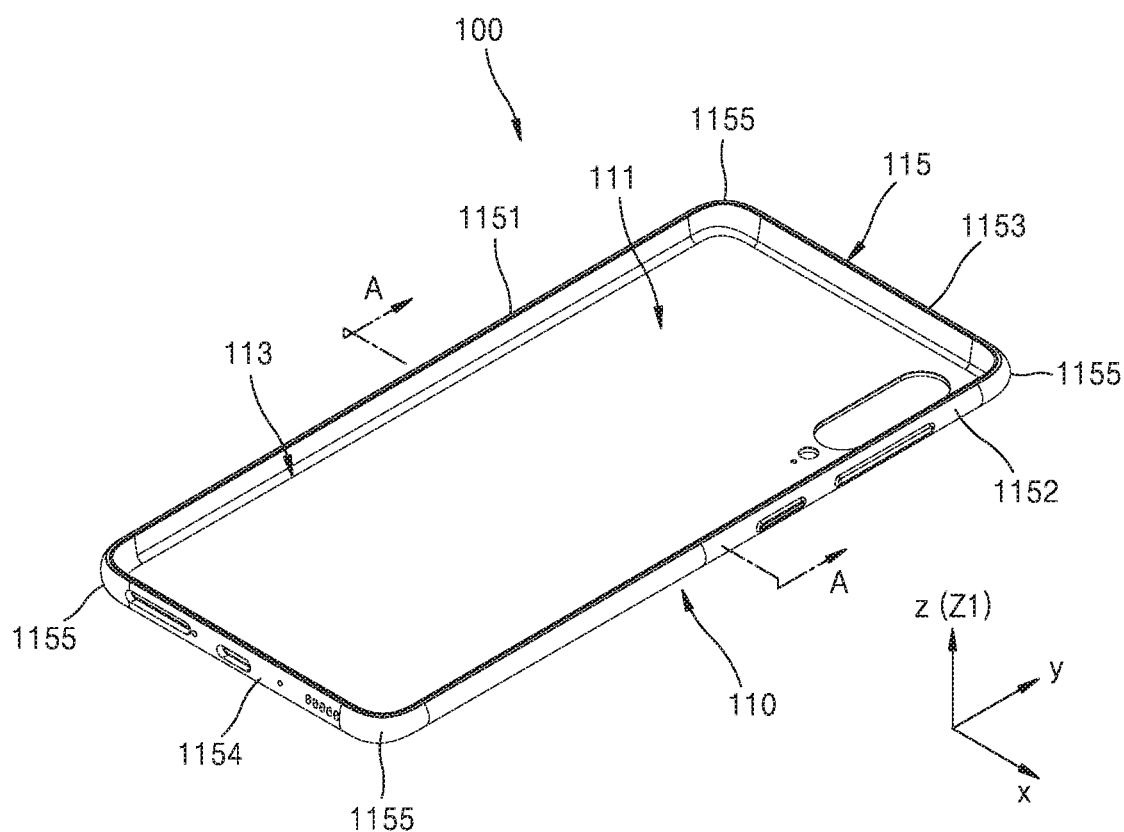
FIG. 3 is a perspective view of a housing structure according to an embodiment of the disclosure.
Figure 4:
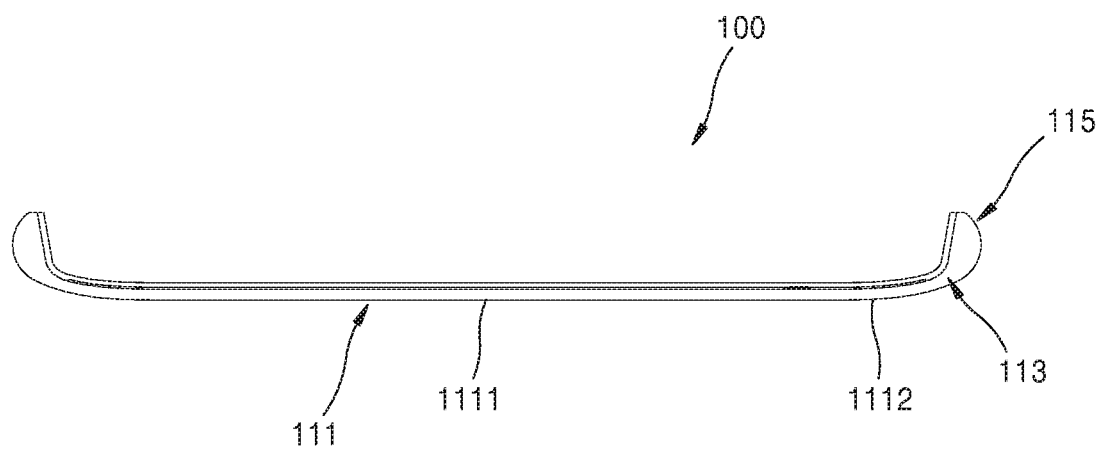
FIG. 4 is a cross-sectional view of a housing structure of FIG. 3, cut along a line A-A.
Figure 5:
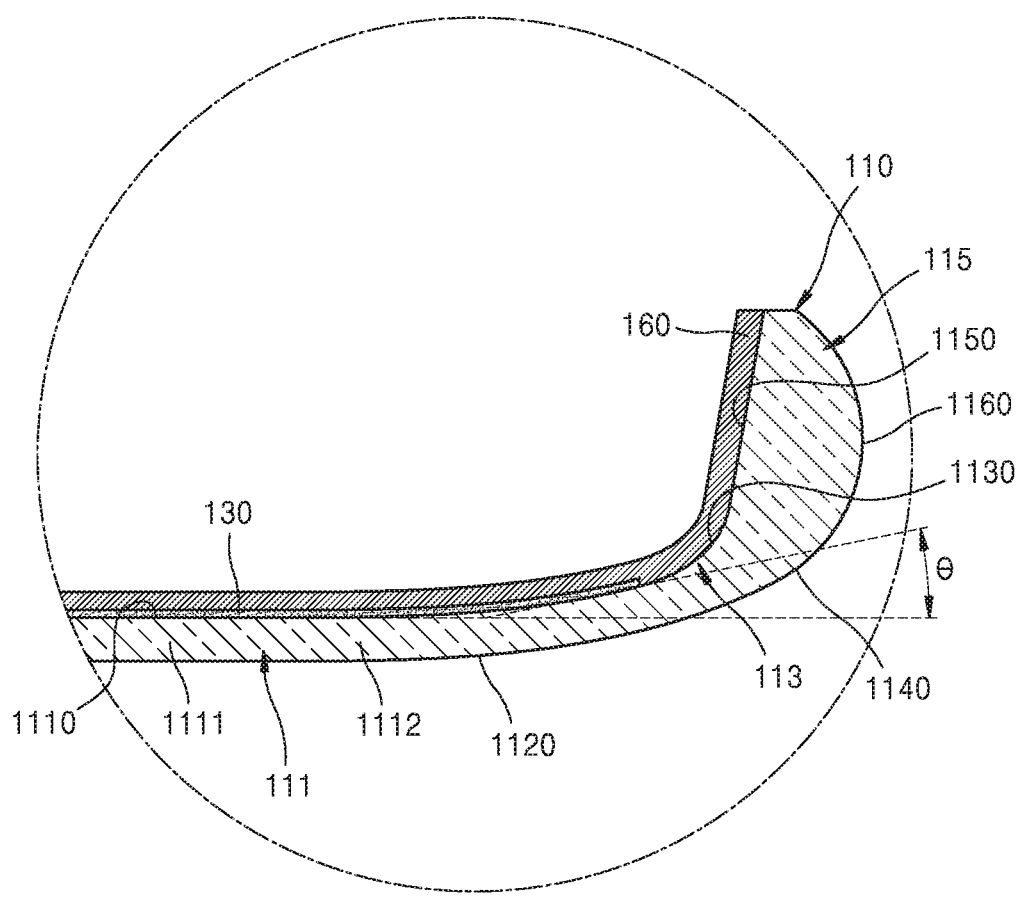
FIG. 5 is an enlarged view of a part of FIG. 4.
Figure 6:
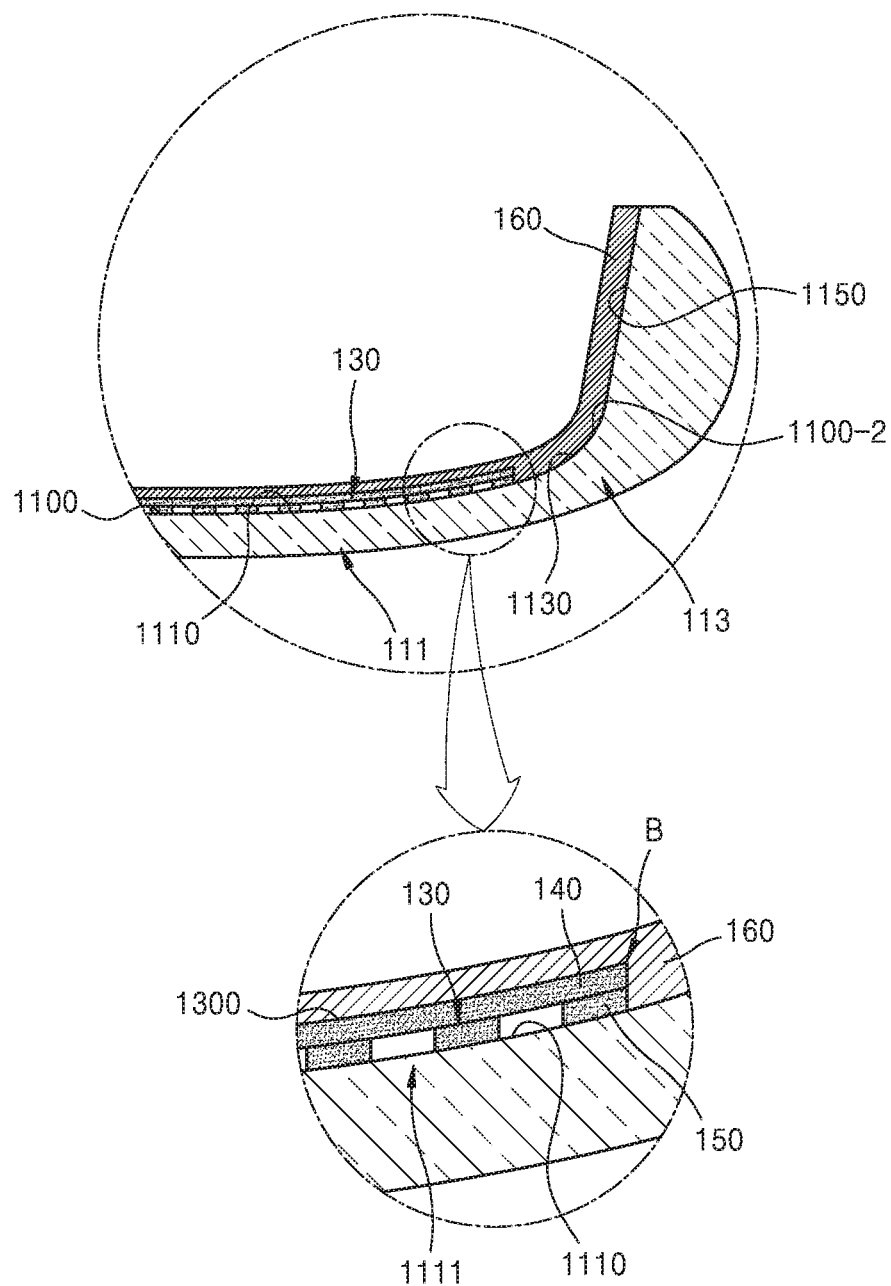
FIG. 6 is a view for describing a transparent pattern layer in a housing structure, according to an embodiment of the disclosure.
Figure 7:
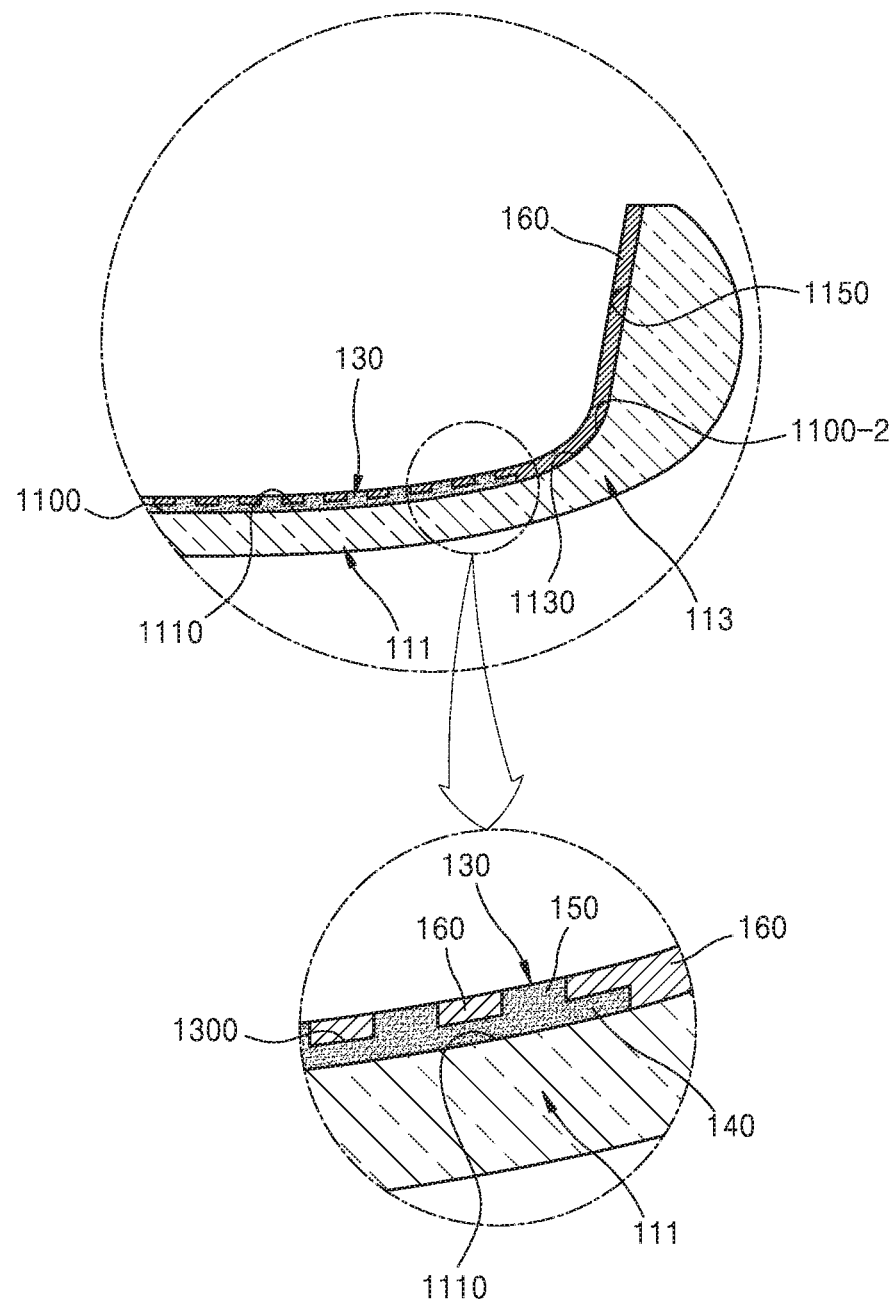
FIG. 7 is a view for describing a transparent pattern layer in a housing structure, according to an embodiment of the disclosure.
Figure 8:
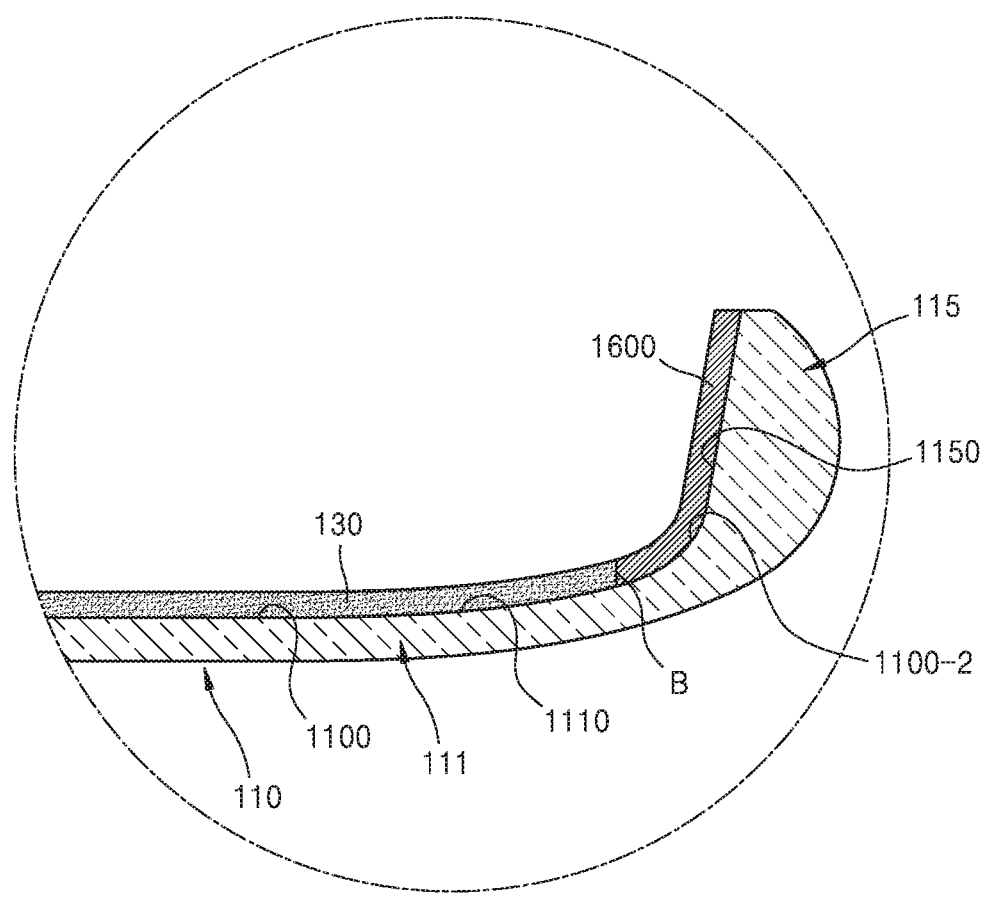
FIG. 8 is a partial cross-sectional view of a housing structure according to a comparative example.

FIG. 3 is a perspective view showing the housing structure 100 according to an embodiment of the disclosure, FIG. 4 is a cross-sectional view of the housing structure 100 of FIG. 3, taken along a line A-A, and FIG. 5 is an enlarged view of a part of FIG. 4. FIGS. 6 and 7 are views for describing a transparent pattern layer 130 in the housing structure 100, according to an embodiment of the disclosure. FIG. 8 is a partial cross-sectional view of the housing structure 100 according to a comparative example.

Referring to FIGS. 3 through 5, the housing structure 100 may occupy a large part of the entire exterior of the electronic device 1 and may provide various colors and shapes. To this end, the housing structure 100 according to an embodiment of the disclosure may include a transparent housing 110, the transparent pattern layer 130, and a color layer 160.

The transparent housing 110 may have transparent characteristics. A transparency of the transparent housing 110 may be equal to or greater than about 50%, and may be less than or equal to about 100%.

The transparent housing 110 is transparent, such that the transparent pattern layer 130 and the color layer 160 arranged inside the transparent housing 110 may be visible from outside. By the transparent pattern layer 130 and the color layer 160 exposed through the transparent housing 110, the side exterior and the back exterior of the electronic device 1 may be visible from the outside.

The transparent housing 110 may include a plastic material. For example, the transparent housing 110 may include polycarbonate (PC).

However, the material of the transparent housing 110 is not limited thereto, and may be various ones as long as the material is a transparent material. For example, the material of the transparent housing 110 may include an inorganic compound. For example, the transparent housing 110 may include transparent ceramic. An example of the transparent ceramic may include glass.

As described above, the material of the transparent housing 110 may include a nonmetal substance. Thus, radio interference by the transparent housing 110 may be minimized, and the transparent housing 110 may be favorable to signal transmission/reception for 5th-generation (5G) mobile communication.

The transparent housing 110 may include a side region 115 arranged on a side face of the electronic device 1 between the front face and a back face of the electronic device 1, a back region 111 arranged on the back face of the electronic device 1, and a connection region 113 connecting the side region 115 with the back region 111. In the transparent housing 110, the side region 115, the back region 111, and the connection region 113 may form one body.

An inner surface 1150 and an outer surface 1160 of the side region 115 may have different shapes. For example, the cross-sectional shape of the inner surface 1150 of the side region 115 may be a linear shape, and the outer surface 1160 of the side region 115 may be a curved shape. A thickness of the side region 115 may vary with a position.

The side region 115 may include four side walls and a corner wall 1155 connecting them.

The four side walls may include a first side wall 1151 and a second side wall 1152 that are arranged in parallel with each other, and a third side wall 1153 and a fourth side wall 1154 that are arranged in parallel with each other in the horizontal direction X between the first side wall 1151 and the second side wall 1152.

The first side wall 1151 may be arranged in a left side of the display module 10, the second side wall 1152 may be located in a right side of the display module 10, the third side wall 1153 may be located in an upper side of the display module 10, and the fourth side wall 1154 may be located in a lower side of the display module 10.

The length of each of the third side wall 1153 and the fourth side wall 1154 may be less than the length of each of the first side wall 1151 and the second side wall 1152. However, the length of each of the third side wall 1153 and the fourth side wall 1154 is not limited thereto, and may be greater than or equal to the length of each of the first side wall 1151 and the second side wall 1152.

An inner surface 1110 and an outer surface 1120 of the back region 111 may have shapes corresponding to each other. A thickness of the back region 111 may be uniform regardless of a position.

The back region 111 may include a (flat) first back wall 1111 and a (curved) second back wall 1112 arranged in an edge of the first back wall 1111 and extending in a direction from the back region 111 to the connection region 113.

An inner surface of the second back wall 1112 may have a specific inclination angle θ with respect to an inner surface of the first back wall 1111. For example, the inclination angle θ of the inner surface of the second back wall 1112 may be greater than 0 degrees and equal to or less than 30 degrees.

The connection region 113 may have a bent shape to connect the side region 115 with the back region 111.

An inner surface 1130 and an outer surface 1140 of the connection region 113 may have different shapes. The inner surface 1130 and the outer surface 1140 of the connection region 113 may have different radiuses of curvature. For example, the radius of curvature of the inner surface 1130 of the connection region 113 may be less than that of the outer surface 1140 of the connection region 113.

The transparent pattern layer 130 may have a pattern and be arranged on the inner surface 1110 of the back region 111. Through the transparent back region 111, the pattern of the transparent pattern layer 130 may be visible from outside.

The pattern of the transparent pattern layer 130 may be implemented in various forms.

For example, the transparent pattern layer 130 may have a regular pattern. In another example, the transparent pattern layer 130 may have an irregular pattern.

For example, the pattern of the transparent pattern layer 130 may be uniform over the entire region. In another example, the pattern of the transparent pattern layer 130 may be a combination of different patterns.

For example, the pattern of the transparent pattern layer 130 may be formed over the entire one surface, but may also be formed partially without being limited thereto.

The transparent pattern layer 130 may include a transparent material or a semi-transparent material. A transparency of the transparent housing 110 may be equal to or greater than about 50%, and may be less than or equal to about 100%.

Referring to FIGS. 6 and 7, the transparent pattern layer 130 may include a base layer 140 and a pattern layer 150 having a pattern.

The base layer 140 may include a transparent material. For example, as an example of the transparent material, polyethylene terephthalate (PET) or polycarbonate may be included.

The pattern layer 150 may be transparent and may include a substance that is curable by ultraviolet (UV) rays. The pattern layer 150 and the base layer 140 may include different materials. However, the pattern layer 150 and the base layer 140 are not necessarily limited as separate layers, and may be one layer having the same material when necessary.

The pattern of the pattern layer 150 may be implemented by a convex and concave structure. For example, the pattern layer 150 may have a periodic structure and may include a plurality of (transparent) elements that are arranged to be disposed apart from each other by the same interval, as shown in FIG. 6. A gap may exist between two adjacent (transparent) elements of the pattern layer 150, and the gap may be filled with atmospheric air. In another example, the pattern layer 150 may include a flat substrate and a plurality of protrusions that are protruded from the flat substrate and are spaced apart from each other by the same interval, at shown in FIG. 7. A gap may exist between two adjacent protrusions of the pattern layer 150, and the gap may be filled with the same material as the color layer 160. However, implementation of the pattern of the pattern layer 150 is not limited thereto, and may be achieved in various ways.

The pattern layer 150 may be arranged on at least a face of the base layer 140. For example, as shown in FIG. 6, the pattern layer 150 may be arranged on a back face facing the back region 111 on the base layer 140. In another example, as shown in FIG. 7, the pattern layer 150 may be arranged on a front face opposing the back face facing the back region 111 on the base layer 140.

The transparent pattern layer 130 may be fixed by an adhesive layer to the inner surface 1110 of the back region 111. However, a method and/or a material for fixing the transparent pattern layer 130 to the back region 111 is not limited thereto, and the adhesive layer is also optional and thus may be omitted. For example, the transparent pattern layer 130 may be fixed to the back region 111 by an insert-injection scheme. In this case, without the adhesive layer between the transparent pattern layer 130 and the back region 111, the transparent pattern layer 130 may be fixed to the back region 111.

The color layer 160 may extend from the inner surface 1300 of the transparent pattern layer 130 to the inner surface 1150 of the side region 115. The color layer 160 may be arranged on the inner surface 1300 of the transparent pattern layer 130 and an inner surface 1100-2 of a region of the inner surface 1100 of the transparent housing 110, the region where the transparent pattern layer 130 is not arranged. For example, the color layer 160 may be arranged on the inner surface 1130 of the transparent pattern layer 130, the inner surface 130 of the connection region 113, and the inner surface 1150 of the side region 115.

The color layer 160 may be arranged on the inner surface 1100 of the transparent housing 110 by using a painting scheme. For example, the color layer 160 may be formed by uniformly spraying color liquid toward the inner surface 1100 of the transparent housing 110. As color liquid is sprayed to the inner surface 1100 of the transparent housing 110 in a state where the transparent pattern layer 130 is fixed to the inner surface 1110 of the back region 111, the color layer 160 may be formed on the inner surface 1300 of the transparent pattern layer 130 where the transparent pattern layer 130 is formed, as well as the inner surface 1150 of the side region 115 and the inner surface 1130 of the connection region 113 where the transparent pattern layer 130 is not located.

However, a scheme to form the color layer 160 is not limited thereto, and other schemes may be used. For example, the color layer 160 may be arranged on the inner surface 1100 of the transparent housing 110 by deposition.

The color layer 160 formed on the inner surface 1150 of the side region 115 and the inner surface 1130 of the connection region 113 may provide the impression of a color for the side region 115 and the connection region 113 of the housing structure 100, and the color layer 160 formed on the inner surface 1300 of the transparent pattern layer 130 may provide the impression of a color for the back region 111 of the housing structure 100.

As the color layer 160 is globally arranged on the inner surface 1100 of the transparent housing 110, including a boundary B between a region where the transparent pattern layer 130 is arranged and a region where the transparent pattern layer 130 is not arranged on the inner surface 1100 of the transparent housing 110, thereby providing a continuous impression of a color for the side exterior and the back exterior of the housing structure 100.

Referring to FIG. 8, when a color layer 1600 is arranged in the region where the transparent pattern layer 130 is not arranged on the inner surface 1100 of the transparent housing 110, the boundary B between the region where the transparent pattern layer 130 is arranged and the region where the transparent pattern layer 130 is not arranged may be unnatural and may provide a disconnected appearance.

Moreover, unlike in an embodiment of the disclosure, the transparent pattern layer 130 in the comparative example may be arranged on not only on the back region 111 of the transparent housing 110 but also on the connection region 113 and the side region 115 to provide a consistent color and/or pattern between the back region 111 and the connection and side regions 113 and 115. However, when a sharp change in an angle occurs in the connection region 113, for example, a change in an angle of the connection region 113 is greater than or equal to 45 degrees, the transparent pattern layer 130 arranged on the connection region 113 may not be correctly fixed on the connection region 113 or cracks may occur in the transparent pattern layer 130. Such structure of the transparent pattern layer 130 in the comparative example may degrade the durability and sturdiness of the electronic device 1, unlike in the embodiment of the present disclosure.

On the other hand, in the electronic device 1 according to an embodiment of the disclosure, the transparent pattern layer 130 may be arranged on the back region 111 of the transparent housing 110 that is relatively easily fixed, and the color layer 160 may be globally arranged on the inner surface 1100 of the transparent housing 110, thereby improving the durability and sturdiness of the electronic device 1 and also providing consistent and seamless color and pattern throughout the entire regions 111, 113, and 115 of the transparent housing 110.

Figure 9:
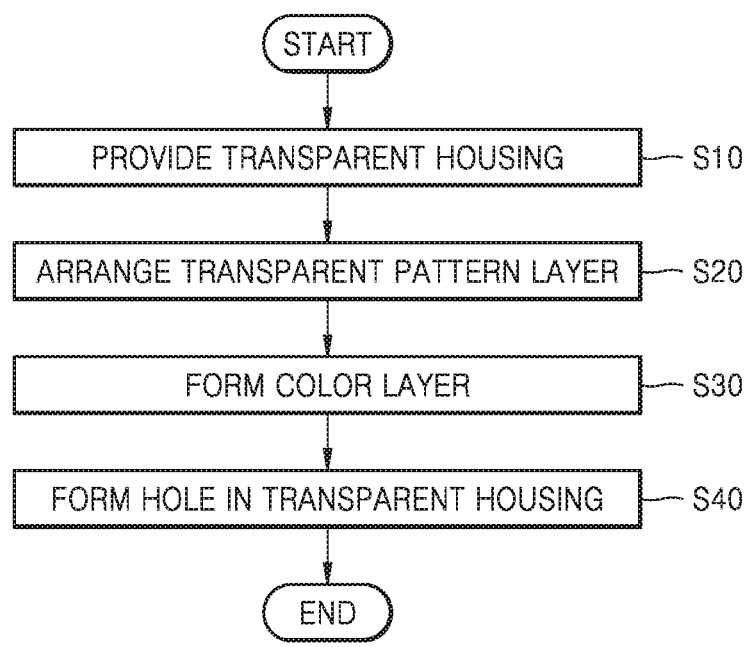
FIG. 9 is a flowchart for describing a method of manufacturing a housing structure of an electronic device, according to an embodiment of the disclosure.

FIG. 9 is a flowchart for describing a method of manufacturing the housing structure 100 of the electronic device 1, according to an embodiment of the disclosure.

Referring to FIG. 9, the transparent housing 110 having a specific shape may be provided in operation S10. The transparent housing 110 may include the side region 115, the back region 111, and the connection region 113 connecting the side region 115 with the back region 111.

The transparent pattern layer 130 having a periodic or non-periodic pattern may be arranged on the back region 111 of the transparent housing 110 in operation S20. By arranging an adhesive layer between the transparent pattern layer 130 and the back region 111, the transparent pattern layer 130 may be fixed to the inner surface 1110 of the back region 111.

In the above-described embodiment of the disclosure, a description has been made using an example where the transparent pattern layer 130 is arranged after molding of the transparent housing 110 and the adhesive layer is arranged between the transparent pattern layer 130 and the back region 111, but the disclosure is not limited thereto. For example, after the transparent pattern layer 130 is inserted into a mold for molding the transparent housing 110, the transparent housing 110 may be molded. Thus, the transparent pattern layer 130 may be formed simultaneously with molding of the transparent housing 110, without a separate adhesive layer.

By spraying color liquid to the inner surface 1100 of the transparent housing 110 in which the transparent pattern layer 130 is fixed, the color layer 160 may be formed in operation S30.

For example, after the transparent housing 110 is erected in the direction of gravity, the color liquid may be sprayed to the inner surface 1100 of the transparent housing 110 without rotation of the transparent housing 110. Thereafter, the color layer 160 may be formed through drying with respect to the inner surface 1100 of the transparent housing 110. The color layer 160 may be arranged on the side region 115 of the transparent housing 110, the inner surface 1130 of the connection region 113, and the inner surface 1300 of the transparent pattern layer 130.

However, a method of forming the color layer 160 on the inner surface 1100 of the transparent housing 110 is not limited thereto, and the color layer 160 may be formed in various ways. For example, after color liquid is coated onto the inner surface 1100 of the transparent housing 110, the color layer 160 may be formed by using a spindle method for rotating the transparent housing 110 or by using other spraying methods. In another example, the color layer 160 may be formed on the inner surface 1100 of the transparent housing 110 by deposition or printing. However, any method as well as deposition or printing may be used to form the color layer 160 on the inner surface 1100 of the transparent housing 110.

Next, a hole in a specific shape may be formed in the transparent housing 110 on the inner surface 1100 on which the transparent pattern layer 130 and the color layer 160 are arranged, in operation S40. By forming a hole after formation of the transparent pattern layer 130 and the color layer 160 on the transparent housing 110, distortion of the transparent pattern layer 130 or the color layer 160 around the hole may be prevented.

Figure 10:
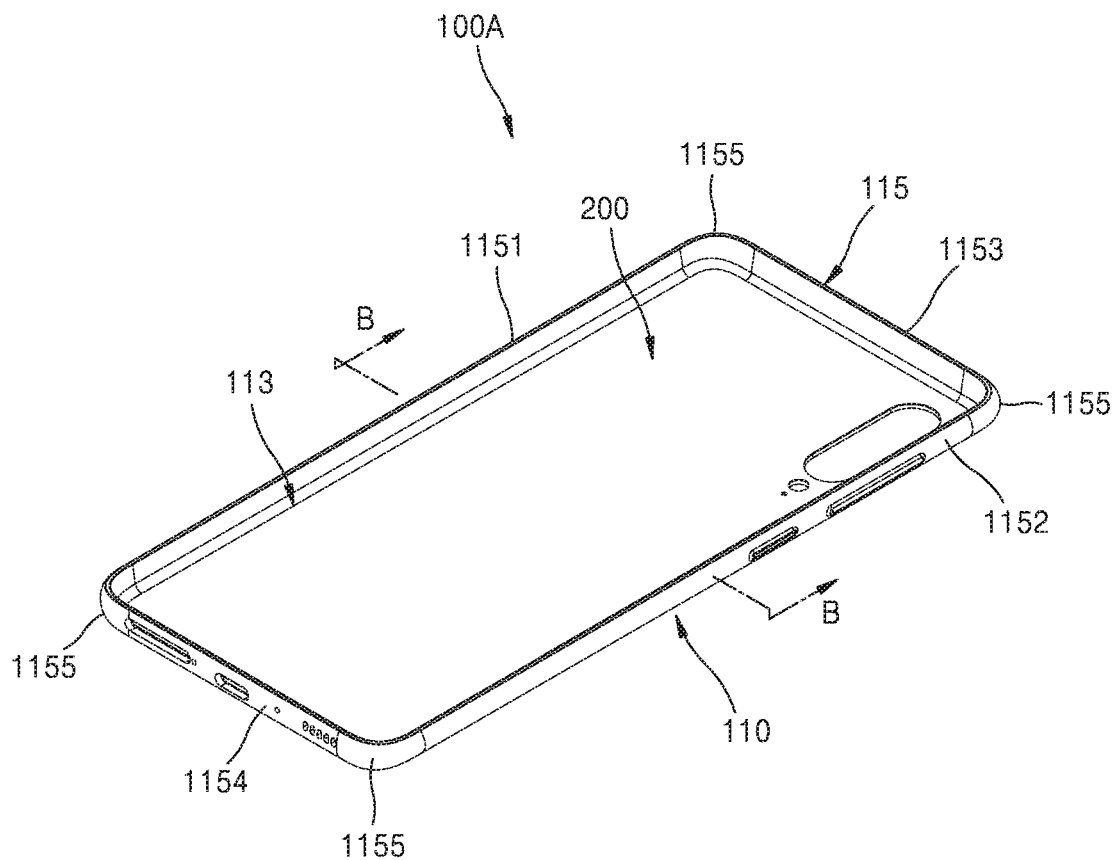
FIG. 10 illustrates a housing structure according to another embodiment of the disclosure.
Figure 11:
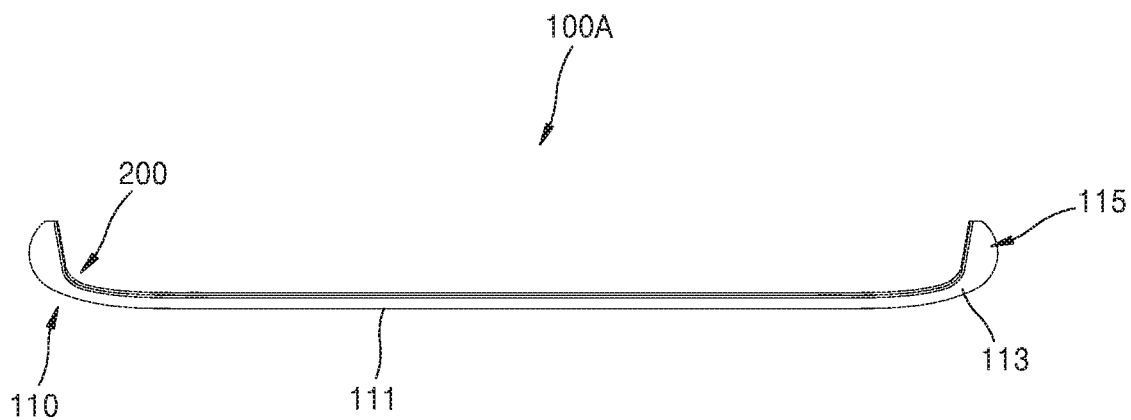
FIG. 11 is a cross-sectional view of the housing structure of FIG. 10.
Figure 12:
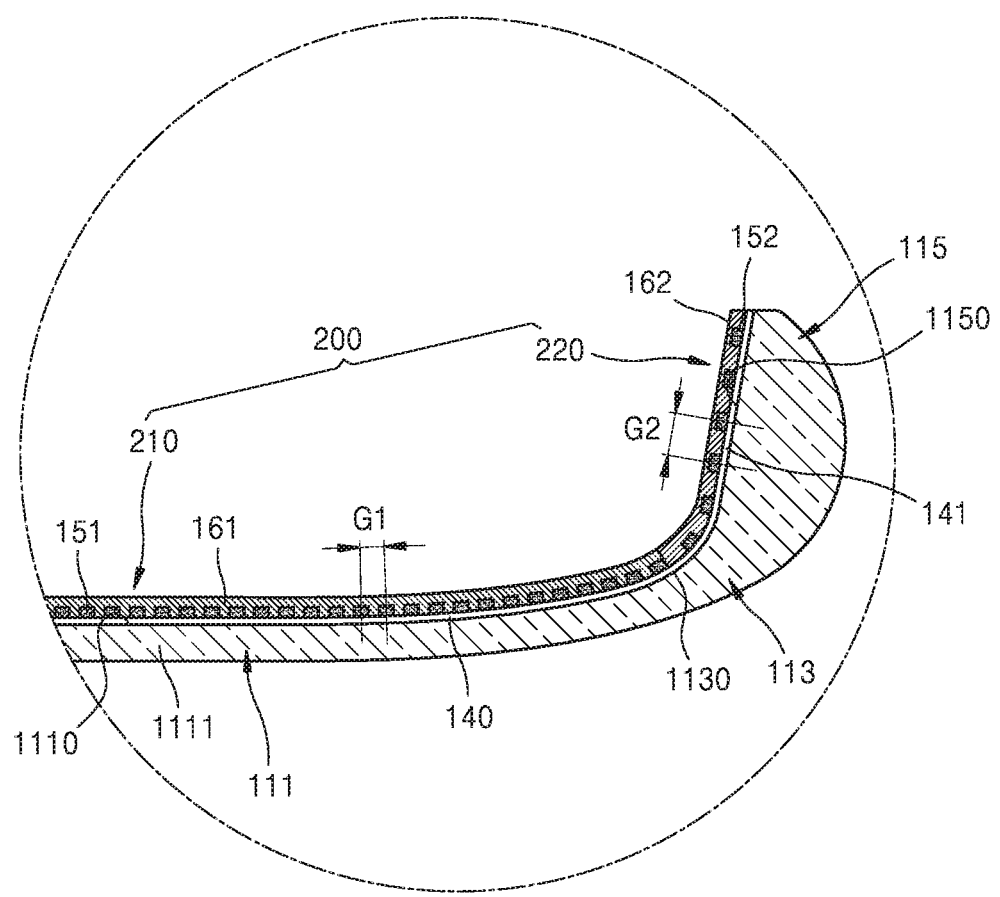
FIG. 12 is an enlarged view of a part of FIG. 11.

FIG. 10 illustrates a housing structure 100A according to another embodiment of the disclosure, FIG. 11 is a cross-sectional view of the housing structure 100A of FIG. 10, taken along a line B-B, and FIG. 12 is an enlarged view of a part of FIG. 11. FIGS. 13A through 13F are views for describing various stacked structures of a first color pattern layer 210 or a second color pattern layer 220.

Referring to FIGS. 10 through 12, the housing structure 100A may include the transparent housing 110 and a color pattern layer 200 arranged on the inner surface 1100 of the transparent housing 110. The color pattern layer 200 may include the first color pattern layer 210 and the second color pattern layer 220. The transparent housing 110 is the same as the transparent housing 110 according to the above-described embodiment of the disclosure, such that a repeated description may be omitted.

The first color pattern layer 210 may be arranged on the inner surface 1110 of the rear region 111 of the transparent housing 110. The first color pattern layer 210 may include a base layer 141, a first pattern layer 151, and a first color layer 161.

The second color pattern layer 220 may be arranged on the inner surface 1150 of the side region 115 of the transparent housing 110. The second color pattern layer 220 may include the base layer 141, a first pattern layer 152, and a second color layer 162. The second color layer 162 may have a color that is different from that of the first color layer 161. However, the second color layer 162 may have the same color as that of the first color layer 161, without being limited thereto.

The base layer 141 of the first color pattern layer 210 and the base layer 151 of the second color pattern layer 220 may be one body. The base layer 141 of the second color pattern layer 220 may extend from the base layer 141 of the first color pattern layer 210. The base layer 141 may be continuously arranged on the back region 113, the connection region 113, and the side region 115.

The second pattern layer 152 may be different from the first pattern layer 151. For example, the second pattern layer 152 may be a patternless layer or a layer having a pattern that is different from that of the first pattern layer 151. When the second pattern layer 152 is a layer having no pattern, it may be referred to as a patternless layer.

The pattern of the second pattern layer 152 may have visibility that is lower than that of the pattern of the first pattern layer 151. For example, a pattern interval G2 of the second pattern layer 152 may be greater than a pattern interval G1 of the first pattern layer 151.

In the connection region 113, either one or both of the first color pattern layer 210 and the second color pattern layer 220 may be arranged. Thus, the first pattern layer 151 or the second pattern layer 152 may be exposed to the outside through the connection region 113.

For example, the second color pattern layer 220 may be arranged on the inner surface 1130 of the connection region 113. Thus, the second pattern layer 152 may be exposed to the outside through the connection region 113.

A sharp change in an angle may occur on the inner surface 1130 of the connection region 113 connecting the back region 111 with the side region 115. For example, the change in the angle of the connection region 113 may be greater than or equal to 45 degrees in a front direction and a rear direction. In particular, in the connection region 113 adjacent to the corner wall 1155 in the side region 115, a sharp change in an angle may occur in the vertical or horizontal direction as well as in the front and rear directions.

Due to the sharp change in the angle in the inner surface 1130 of the connection region 113, the pattern of the second pattern layer 152 may be distorted. However, the pattern of the second pattern layer 152 may have visibility that is lower than that of the pattern of the first pattern layer 151, and therefore may provide a consistent and seamless appearance in spite of distortion of the pattern.

Referring to FIGS. 13A through 13E, a stacked order of the base layer 141, the first pattern layer 151, and the first color layer 161 of the first color pattern layer 210 may be various ones.

Figure 13A:
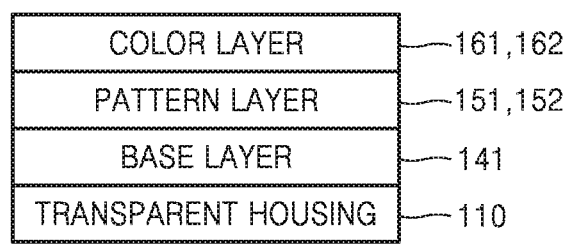
FIG. 13A is a view for describing various stacked structure of a first color pattern layer or a second color pattern layer.
Figure 13B:
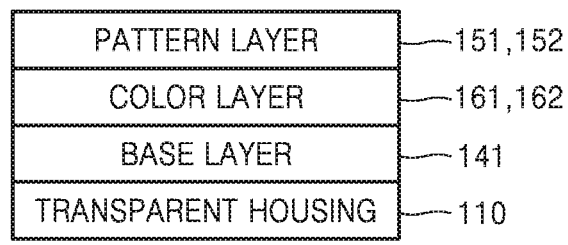
FIG. 13B is a view for describing various stacked structure of a first color pattern layer or a second color pattern layer.

Referring to FIG. 13A, the base layer 141, the first pattern layer 151, and the first color layer 161 may be arranged on the inner surface of the transparent housing 110. Referring to FIG. 13B, the base layer 141, the first pattern layer 161, and the first color layer 151 may be arranged on the inner surface of the transparent housing 110.

Figure 13C:
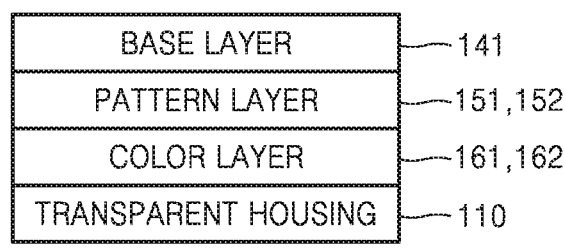
FIG. 13C is a view for describing various stacked structure of a first color pattern layer or a second color pattern layer.
Figure 13D:
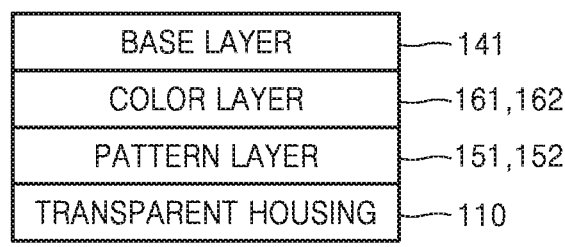
FIG. 13D is a view for describing various stacked structure of a first color pattern layer or a second color pattern layer.

Referring to FIG. 13C, the first color layer 161, the first pattern layer 151, and the base layer 141 may be arranged on the inner surface of the transparent housing 110. Referring to FIG. 13D, the first pattern layer 151, the first color layer 161, and the base layer 141 may be arranged on the inner surface of the transparent housing 110.

Figure 13E:
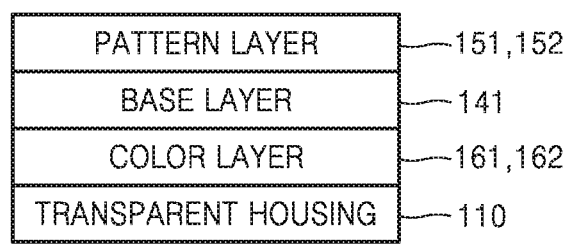
FIG. 13E is a view for describing various stacked structure of a first color pattern layer or a second color pattern layer.
Figure 13F:
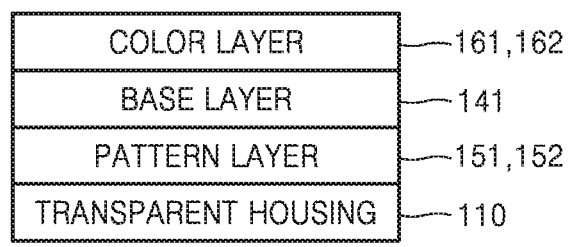
FIG. 13F is a view for describing various stacked structure of a first color pattern layer or a second color pattern layer.

Referring to FIG. 13E, the first color layer 161, the base layer 141, and the first pattern layer 151 may be arranged on the inner surface of the transparent housing 110. Referring to FIG. 13F, the first pattern layer 151, the base layer 141, and the first color layer 161 may be arranged on the inner surface of the transparent housing 110.

A stacked order of the base layer 141, the second pattern layer 152, and the second color layer 162 of the second color pattern layer 220 may be various ones.

Referring to FIG. 13A, the base layer 141, the second pattern layer 152, and the second color layer 162 may be arranged on the inner surface of the transparent housing 110. Referring to FIG. 13B, the base layer 141, the second pattern layer 162, and the second color layer 152 may be arranged on the inner surface of the transparent housing 110.

Referring to FIG. 13C, the second color layer 162, the second pattern layer 152, and the base layer 141 may be arranged on the inner surface of the transparent housing 110. Referring to FIG. 13D, the second pattern layer 152, the second color layer 162, and the base layer 141 may be arranged on the inner surface of the transparent housing 110.

Referring to FIG. 13E, the second color layer 162, the base layer 141, and the second pattern layer 152 may be arranged on the inner surface of the transparent housing 110. Referring to FIG. 13F, the second pattern layer 152, the base layer 141, and the second color layer 162 may be arranged on the inner surface of the transparent housing 110.

Figure 14:
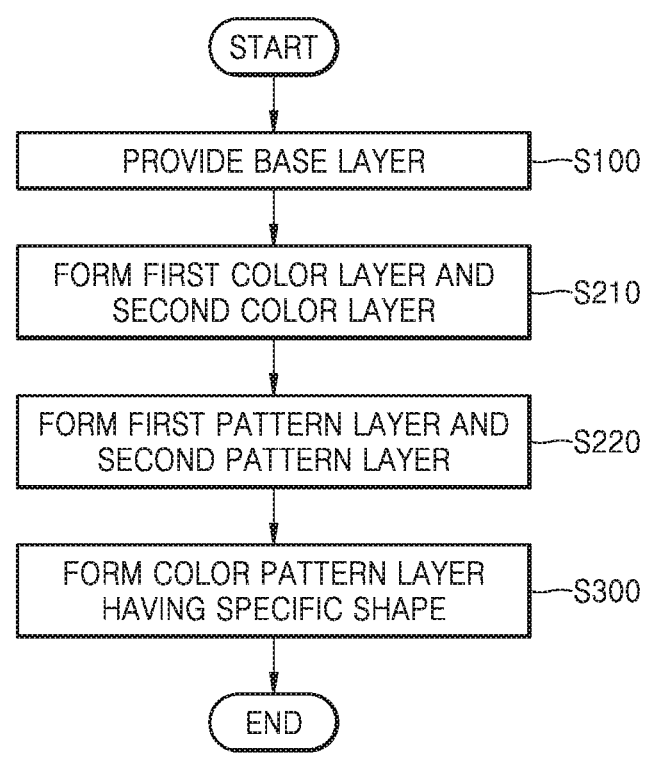
FIG. 14 is a flowchart for describing a process of forming a color pattern layer, according to an embodiment of the disclosure.
Figure 15:
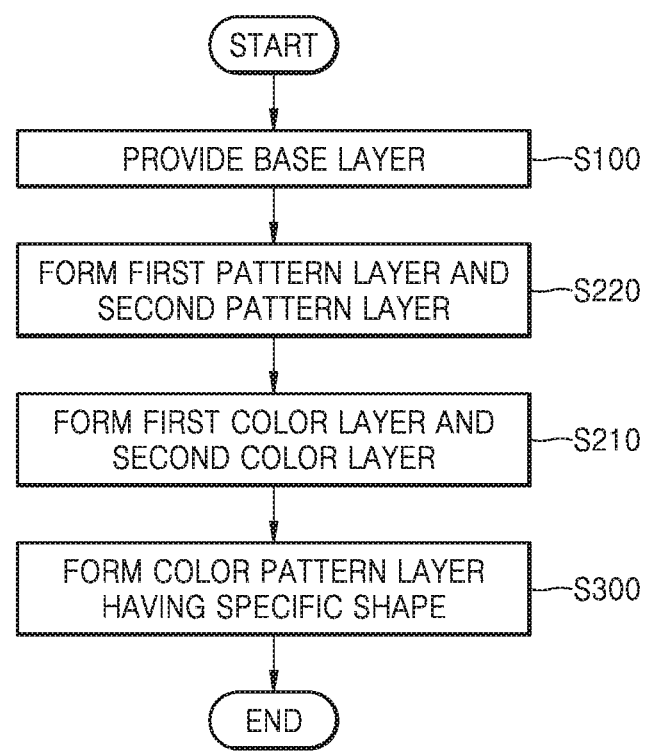
FIG. 15 is a flowchart for describing a process of forming a color pattern layer, according to an embodiment of the disclosure.
Figure 16:
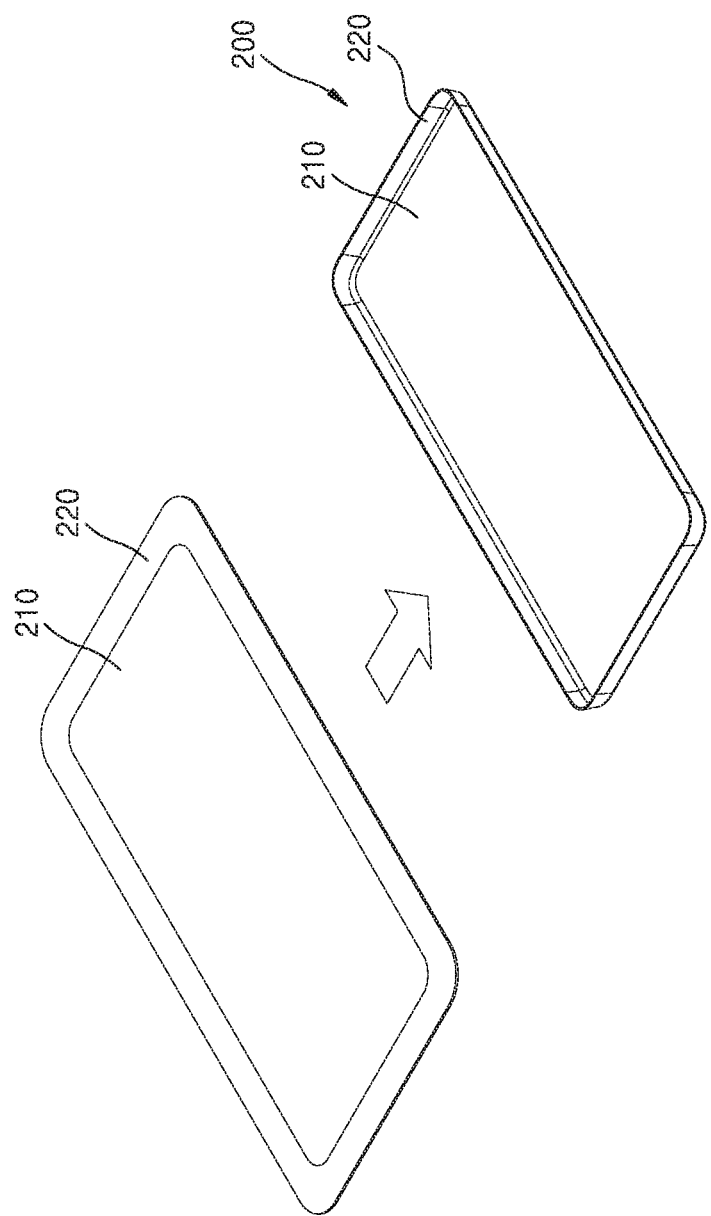
FIG. 16 is a view for describing a process of forming a color pattern layer having a specific shape.

FIGS. 14 and 15 are flowcharts for describing a process of forming a color pattern layer 200, according to an embodiment of the disclosure. FIG. 16 is a view for describing a process of forming the color pattern layer 200 having a specific shape.

Referring to FIG. 14, the base layer 141 having a specific thickness in a flat state may be provided in operation S100.

The base layer 141 may include a transparent material. For example, as an example of the transparent material, PET or polycarbonate may be included.

The first color layer 161 and the second color layer 162 may be formed on the base layer 141 in operation S210. The second color layer 162 may be formed in an edge of the first color layer 161. The second color layer 162 may have a color that is different from that of the first color layer 161, but may also have the same color as that of the first color layer 161 without being limited thereto.

The first pattern layer 151 and the second pattern layer 152 may be formed on the base layer 141 in operation S220.

For example, the first pattern layer 151 and the second pattern layer 152 may be formed on a face of the base layer 141. The second pattern layer 152 may be formed in an edge of the first pattern layer 151. The second pattern layer 152 may have a pattern that is different from that of the first pattern layer 151.

In another example, the first pattern layer 151 and the second pattern layer 152 may be formed on the first color layer 161 and the second color layer 162 formed on the base layer 141. The second pattern layer 152 may be formed in an edge of the first pattern layer 151. The second pattern layer 152 may have a pattern that is different from that of the first pattern layer 151.

While the first color layer 161 and the second layer 162 are described as being formed prior to the first pattern layer 151 and the second pattern layer 152 with reference to FIG. 14, the disclosure is not limited thereto. For example, as shown in FIG. 15, operation S220 of forming the first pattern layer 151 and the second pattern layer 152 may be performed prior to operation S210 of forming the first color layer 161 and the second color layer 162.

Through the above-described process, the first color layer 161 and the second color layer 162 and the first pattern layer 151 and the second pattern layer 152 may be formed on the base layer 141. That is, the first color pattern layer 201 and the second color pattern layer 220 may be formed.

The first color pattern layer 210 and the second color pattern layer 220 may be formed in a shape corresponding to the inner surface of the transparent housing 110 in operation S300. Referring to FIG. 16, the first color pattern layer 210 and the second color pattern layer 220 having the base layer 141 in a flat state may be formed in a shape corresponding to the inner surface 1100 of the transparent housing 110 including the back region 111, the connection region 113, and the side region 115. In this way, the color pattern layer 200 having a specific shape may be formed.

Thereafter, the color pattern layer 200 having the specific shape may be arranged on the inner surface 1100 of the transparent housing 110.

In the above-described embodiments of the disclosure, the transparent housing 110 forms the entire side face of the electronic device 1. However, the structure of the transparent housing 110 is not limited thereto. For example, the housing structure 100 may further include a metal frame arranged between the edge of the display module 10 and the transparent housing 110. Thus, the side of the electronic device 1 may be formed by the metal frame and the transparent housing 110.

The electronic device and the housing structure used therein according to an embodiment of the disclosure may have natural color and pattern while applying a film to an inner surface of a housing.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electronic device comprising:
    a display arranged on a front face of the electronic device; and
    a housing structure forming at least a part of a side exterior of the electronic device and a back exterior of the electronic device,
    wherein the housing structure comprises:
        a transparent housing comprising a side region arranged on a side face of the electronic device, a back region arranged on a back face of the electronic device, and a connection region connecting the side region with the back region;
        a transparent pattern layer arranged on an inner surface of the back region of the transparent housing and comprising a pattern; and
        a color layer disposed on an inner surface of the transparent pattern layer in the back region of the transparent housing, and disposed on an inner surface of the side region of the transparent housing to be disposed on a region of the transparent housing where the transparent pattern layer is not arranged.

2. The electronic device of claim 1, wherein the color layer is arranged on the inner surface of the transparent pattern layer and an inner surface of a region where the transparent pattern layer is not arranged on the inner surface of the transparent housing.

3. The electronic device of claim 2, wherein the color layer is arranged to cover the inner surface of the transparent pattern layer, an inner surface of the connection region of the transparent housing, and an inner surface of the side region of the transparent housing.

4. The electronic device of claim 1, wherein the side region, the back region, and the connection region of the transparent housing are formed as one body.

5. The electronic device of claim 1, wherein a transparency of the transparent pattern layer is greater than or equal to 50%.

6. The electronic device of claim 1, wherein the transparent pattern layer comprises:
    a base layer; and
    a pattern layer arranged on the base layer.

7. The electronic device of claim 6, wherein the pattern layer is arranged to face the back region on the base layer.

8. The electronic device of claim 6, wherein the pattern layer is arranged to face a surface opposing the back region on the base layer.

9. The electronic device of claim 1,
    wherein the transparent pattern layer comprises a plurality of transparent elements that are disposed apart from each other by a same interval.

10. The electronic device of claim 1, wherein the back region of the transparent housing comprises a flat back wall and a curved back wall that is arranged on an edge of the flat back wall and extends in a direction from the back region to the connection region of the transparent housing.

11. A housing structure configured to cover an electronic device, the housing structure comprising:
    a transparent housing comprising a side region arranged on a side face of the electronic device, a back region arranged on a back face of the electronic device, and a connection region connecting the side region with the back region;
    a transparent pattern layer arranged on an inner surface of the back region of the transparent housing and comprising a pattern; and
    a color layer disposed on an inner surface of the transparent pattern layer in the back region of the transparent housing, and disposed on an inner surface of the side region of the transparent housing to be disposed on a region of the transparent housing where the transparent pattern layer is not arranged.

12. The housing structure of claim 11, wherein the color layer is arranged on the inner surface of the transparent pattern layer and an inner surface of a region where the transparent pattern layer is not arranged on the inner surface of the transparent housing.

13. The housing structure of claim 12, wherein the color layer is arranged to cover the inner surface of the transparent pattern layer, an inner surface of the connection region of the transparent housing, and an inner surface of the side region of the transparent housing.

14. The housing structure of claim 11, wherein the side region, the back region, and the connection region of the transparent housing are formed as one body.

15. The housing structure of claim 11, wherein a transparency of the transparent pattern layer is greater than or equal to 50%.

16. The housing structure of claim 11, wherein the transparent pattern layer comprises:
a base layer; and
a pattern layer arranged on the base layer.

17. The housing structure of claim 16, wherein the pattern layer is arranged to face the back region on the base layer.

18. The housing structure of claim 16, wherein the pattern layer is arranged to face a surface opposing the back region on the base layer.

19. The housing structure of claim 11,
wherein the transparent pattern layer comprises a plurality of transparent elements that are disposed apart from each other by a same interval.

20. The housing structure of claim 11, wherein the back region comprises a flat back wall and a curved back wall that is arranged on an edge of the flat back wall and extends in a direction from the back region to the connection region of the transparent housing.

\* \* \* \* \*